United States Patent
Jelinek et al.

(10) Patent No.: US 12,057,316 B2
(45) Date of Patent: Aug. 6, 2024

(54) SEMICONDUCTOR DEVICE FABRICATED USING CHANNELING IMPLANT

(71) Applicant: Infineon Technologies AG, Neubiberg (DE)

(72) Inventors: Moriz Jelinek, Villach (AT); Paul Ellinghaus, Unterhaching (DE); Axel Koenig, Villach (AT); Caspar Leendertz, Munich (DE); Hans-Joachim Schulze, Taufkirchen (DE); Werner Schustereder, Villach (AT)

(73) Assignee: Infineon Technologies AG, Neubiberg (DE)

( * ) Notice: Subject to any disclaimer, the term of this patent is extended or adjusted under 35 U.S.C. 154(b) by 303 days.

(21) Appl. No.: 17/476,829

(22) Filed: Sep. 16, 2021

(65) Prior Publication Data
US 2023/0083106 A1   Mar. 16, 2023

(51) Int. Cl.
| H01L 21/265 | (2006.01) |
| H01L 21/04 | (2006.01) |
| H01L 29/04 | (2006.01) |
| H01L 29/16 | (2006.01) |
| H01L 29/167 | (2006.01) |

(52) U.S. Cl.
CPC .......... H01L 21/047 (2013.01); H01L 29/045 (2013.01); H01L 29/1608 (2013.01)

(58) Field of Classification Search
CPC .......... H01L 29/1608; H01L 29/66053; H01L 29/066068; H01L 21/02529; H01L 21/02378; H01L 21/02447; H01L 2924/10272
See application file for complete search history.

(56) References Cited

U.S. PATENT DOCUMENTS

| 9,929,284 | B1 | 3/2018 | Zhang et al. |
| 2014/0021590 | A1* | 1/2014 | Schulze ............ H01L 21/26513 257/E21.04 |
| 2016/0190301 | A1 | 6/2016 | Aichinger et al. |
| 2017/0345891 | A1 | 11/2017 | Van Brunt et al. |
| 2018/0138271 | A1* | 5/2018 | Ohse .................. H01L 29/0878 |
| 2022/0359710 | A1* | 11/2022 | Zhang ................ H01L 29/1095 |

OTHER PUBLICATIONS

"Channeling implantations of Al+ into 6H silicon carbide" by E. Morvan et al. in Appl. Phys. Lett. 74, 3990-3992 (Year: 1999).*
Jian Chen, et al., "A Review of Superjunction Vertical Diffused MOSFET", IETE Technical Review, Feb. 23, 2012, vol. 29, Issue 1, pp. 44-52.
Gerhard Hobler, et al., "Simulation Study of Al Channeling in 4H—SIC", Conference: Ion Implantation Technology 2018, Würzburg, Bavaria.

* cited by examiner

*Primary Examiner* — Eric A. Ward
(74) *Attorney, Agent, or Firm* — Cooper Legal Group LLC (57) ABSTRACT

A method includes orienting a silicon carbide layer to a first crystal channel direction relative to a first ion beam and implanting phosphorous into the silicon carbide layer using the first ion beam to define a first doped region in the silicon carbide layer. A deviation angle between the first crystal channel direction and the first ion beam is less than ±1° and the first crystal channel direction comprises a <0001> direction or a <11-23> direction.

23 Claims, 4 Drawing Sheets

SEMICONDUCTOR DEVICE FABRICATED USING CHANNELING IMPLANT

TECHNICAL FIELD

The present disclosure relates to semiconductor devices, for example to silicon carbide (SiC) semiconductor devices and manufacturing methods therefore.

BACKGROUND

Semiconductor devices include doped regions formed by ion implantation.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

According to some embodiments, a method includes orienting a silicon carbide layer to a first crystal channel direction relative to a first ion beam and implanting phosphorous into the silicon carbide layer using the first ion beam to define a first doped region in the silicon carbide layer. A deviation angle between the first crystal channel direction and the first ion beam is less than ±1° and the first crystal channel direction comprises a <0001> direction or a <11-23> direction.

According to some embodiments, an apparatus includes means for orienting a silicon carbide layer to a first crystal channel direction relative to a first ion beam and means for implanting phosphorous into the silicon carbide layer using the first ion beam to define a first doped region in the silicon carbide layer. A deviation angle between the first crystal channel direction and the first ion beam is less than ±1° and the first crystal channel direction comprises a <0001> direction or a <11-23> direction.

According to some embodiments, a method includes orienting a silicon carbide layer to a first crystal channel direction relative to a first ion beam and implanting nitrogen into the silicon carbide layer using the first ion beam to define a first doped region in the silicon carbide layer. The first crystal channel direction comprises a <0001> direction and a deviation angle between the first crystal channel direction and the first ion beam is less than ±1°.

According to some embodiments, an apparatus includes means for orienting a silicon carbide layer to a first crystal channel direction relative to a first ion beam and means for implanting nitrogen into the silicon carbide layer using the first ion beam to define a first doped region in the silicon carbide layer. The first crystal channel direction comprises a <0001> direction and a deviation angle between the first crystal channel direction and the first ion beam is less than ±1°.

According to some embodiments, a semiconductor device includes a semiconductor body comprising a first doped region and a first surface. The semiconductor body comprises silicon carbide, the first doped region comprises a primary implantation peak having a first dopant concentration at a first depth from the first surface and a channeling implantation peak having a second dopant concentration at a second depth from the first surface. A vertical extension region is defined between the first depth and the second depth. A ratio between a maximum dopant concentration in the vertical extension region and a minimum dopant concentration in the vertical extension region is less than about 2.0.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

The term "over" and/or "overlying" is not to be construed as meaning only "directly over" and/or "having direct contact with". Rather, if one element is "over" and/or "overlying" another element (e.g., a region is overlying another region), a further element (e.g., a further region) may be positioned between the two elements (e.g., a further region may be positioned between a first region and a second region if the first region is "over" and/or "overlying" the second region). Further, if a first element is "over" and/or "overlying" a second element, at least some of the first element may be vertically coincident with the second element, such that a vertical line may intersect the first element and the second element.

The semiconductor substrate or body may extend along a main extension plane. The term "horizontal" as used in this specification intends to describe an orientation substantially parallel to said main extension plane. A first or main horizontal side of the semiconductor substrate or body may run substantially parallel to horizontal directions or may have surface sections that enclose an angle of at most 8° (or at most 6° or at most 4°) with the main extension plane. The first or main horizontal side can be for instance the surface of a wafer or a die. Sometimes, the horizontal direction is also referred to as lateral direction.

The term "vertical" as used in this specification intends to describe an orientation which is substantially arranged perpendicular to the horizontal direction, (e.g., parallel to the normal direction of the first side of the semiconductor substrate or body or parallel to the normal direction of a surface section of the first side of the semiconductor substrate or body).

The Figures illustrate relative doping concentrations by indicating "−" or "+" next to the doping type "n" or "p". For example, "n-" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

In accordance with the present disclosure, a semiconductor device and a method of manufacturing the semiconductor device are provided.

The embodiments described herein may be combined in any way.

Figure 1:
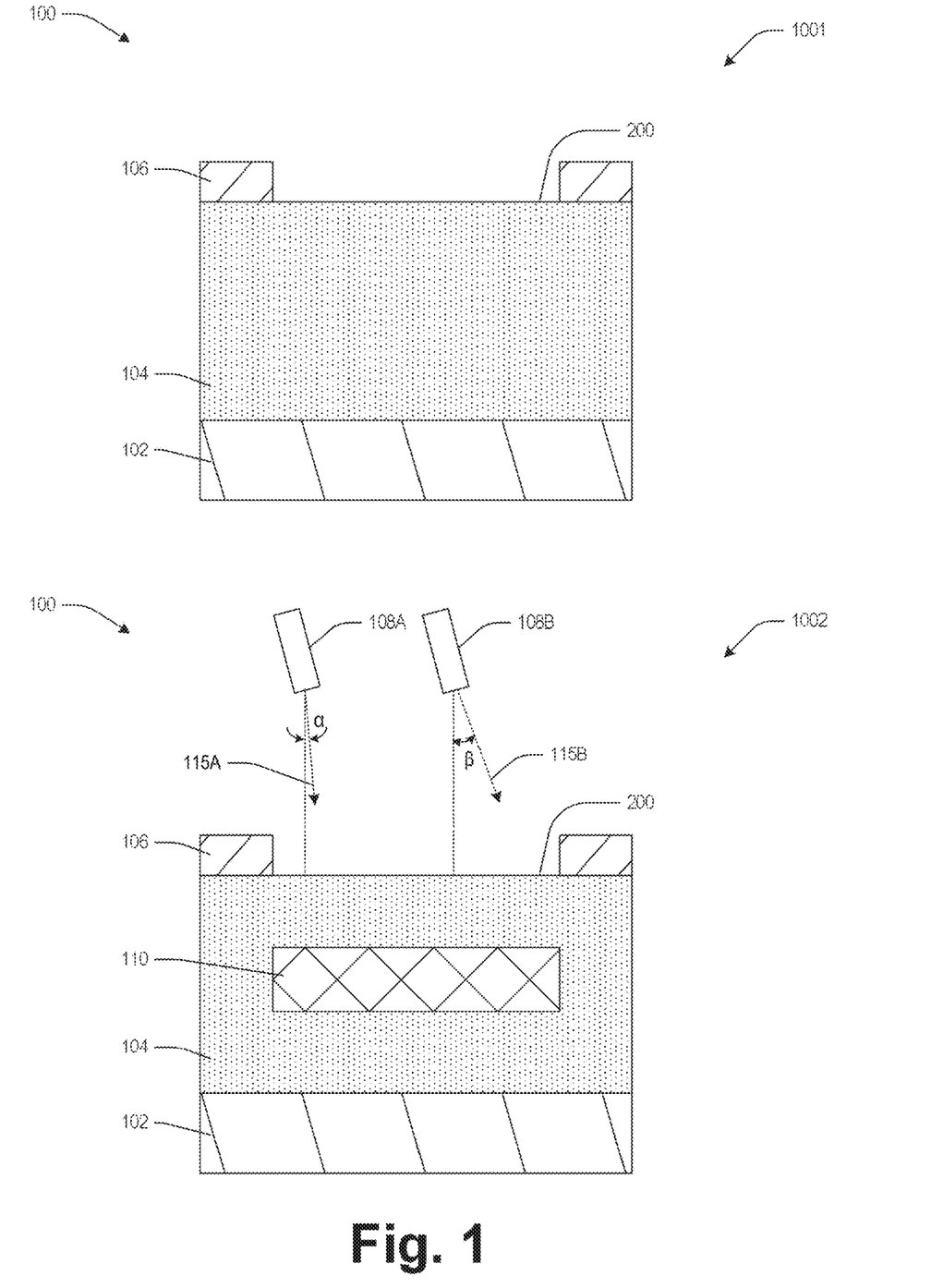
FIG. 1 schematically illustrates acts of manufacturing a semiconductor device according to various examples.

FIG. 1 illustrates aspects with respect to manufacturing a semiconductor arrangement 100 according to various examples of the present disclosure. At 1001, the semiconductor arrangement 100 comprises a semiconductor body 102, a drift layer 104 formed over the semiconductor body 102, and a mask 106 formed over the drift layer 104.

In some embodiments, the semiconductor body 102 comprises crystalline semiconductor material. The semiconductor body 102 comprises silicon carbide (SiC) and/or other semiconductor compounds. The semiconductor body 102 may comprise dopants (e.g., nitrogen (N), phosphorus (P), beryllium (Be), boron (B), aluminum (Al), gallium (Ga) and/or other dopants). Alternatively and/or additionally, the semiconductor body 102 may comprise impurities (e.g., hydrogen, fluorine, oxygen and/or other impurities).

In some embodiments, an epitaxial growth process is performed to form the drift layer 104 using the semiconductor body 102 as a growth template. The semiconductor body 102 and the drift layer 104 may be a semiconductor material, such as SiC (e.g. having a hexagonal crystal structure), GaN, $Ga_2O_3$, diamond, InP, AlP, a ternary group III-V semiconductor, such as AlGaN, InGaN, InGaP, InAlP, or some other suitable material alone or in combination. In some embodiments, the semiconductor body 102 and the drift layer 104 have a band gap of about 2.4 eV to 3.4 eV. In some embodiments, the semiconductor body 102 and the drift layer 104 have a band gap greater than 2 eV (a so-called wide band gap semiconductor). In some embodiments, the semiconductor body 102 and/or the drift layer 104 comprises an n-type impurity, such as at least one of phosphorous, arsenic, or another suitable n-type dopant provided at an n-concentration. In some embodiments, the semiconductor body 102 and/or the drift layer 104 comprises a p-type impurity, such as at least one of boron, aluminum, indium, boron trifluoride, or another suitable p-type dopant provided at a p-concentration.

Figure 2:
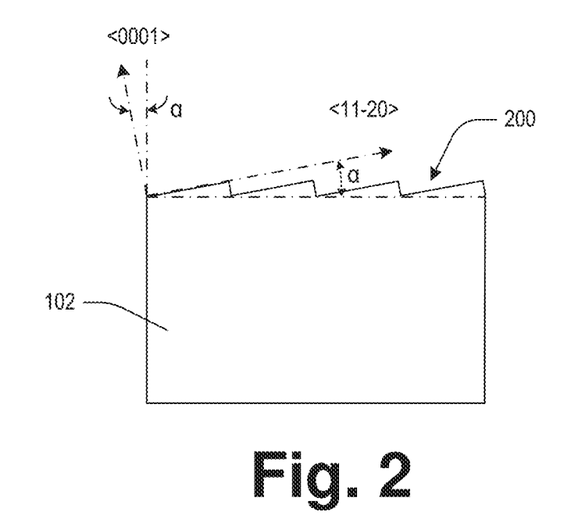
FIG. 2 is a diagram illustrating a surface orientation of a semiconductor body according to various examples.

Referring to FIG. 2, a diagram illustrating the surface orientation of the semiconductor body 102 is provided, according to some embodiments. In some embodiments, the semiconductor body 102 comprises a hexagonal phase of silicon carbide, e.g., 4H-SiC. In some embodiments, the <0001> crystal axis of the semiconductor body 102 (c-axis) is tilted by an off-axis angle α to a surface normal to the first surface. Accordingly, the <11-20> crystal axis may be tilted by the off-axis angle α with respect to the horizontal plane. The off-axis angle α may be in a range from 2° to 8°. For example, the off-axis angle α may be 4°. In some embodiments, due to the tilted crystal orientation, an upper surface 200 of the semiconductor body 102 has a saw tooth surface microstructure after the semiconductor material is sliced into wafers.

According to some embodiments, the mask 106 (FIG. 1) comprises a plurality of individually formed layers that together define a mask stack. In some embodiments, the mask 106 comprises at least one of a hard mask layer, a bottom antireflective coating (BARC) layer, an organic planarization layer (OPL), or a photoresist layer.

The hard mask layer is formed by at least one of physical vapor deposition (PVD) (e.g., sputtering and/or evaporation), chemical vapor deposition (CVD) (e.g., low pressure CVD (LPCVD), ultrahigh vacuum CVD (UHVCVD), reduced pressure CVD (RPCVD), plasma-enhanced CVD (PECVD) and/or atmospheric pressure CVD (APCVD)), spin on, growth, or other suitable techniques. In some embodiments, the hard mask layer comprises at least one of silicon and oxygen, silicon and nitrogen, nitrogen, silicon (e.g., polycrystalline silicon) or other suitable materials. In some embodiments, the BARC layer is a polymer layer that is applied using a spin coating process. In some embodiments, the OPL comprises a photo-sensitive organic polymer that is applied using a spin coating process. In some embodiments, the OPL comprises a dielectric layer. In some embodiments, the photoresist layer is formed by at least one of spinning, spray coating, or other suitable techniques, according to some embodiments. The photoresist is a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative image of a pattern defined by opaque regions of a template, such as a mask, between the light source and the negative photoresist. In a positive photoresist, illuminated regions of the positive photoresist become soluble and are removed via application of a solvent during development. Thus, a pattern formed in the positive photoresist is a positive image of opaque regions of the template, such as a mask, between the light source and the positive photoresist. One or more etchants have a selectivity such that the one or more etchants remove or etch away one or more layers exposed or not covered by the photoresist at a greater rate than the one or more etchants remove or etch away the photoresist. Accordingly, an opening in the photoresist allows the one or more etchants to form a corresponding opening in the one or more layers under the photoresist, and thereby transfer a pattern in the photoresist to the one or more layers under the photoresist. The photoresist is stripped or washed away after the pattern transfer. In some embodiments, the photoresist layer is exposed using a radiation source and a reticle to define a pattern in the photoresist layer and portions of the photoresist layer are removed to define a patterned photoresist layer. The underlying OPL, BARC layer, and hard mask layer are etched using the patterned photoresist layer as a template to form the mask 106 and expose portions of the drift layer 104 under the mask 106.

At 1002 (FIG. 1), an implantation process is performed using an ion source 108A, 108B to form a doped region 110 in the drift layer 104. In an ion beam implantation process, if the direction of dopant ions incident upon the surface of a monocrystalline substrate is sufficiently tilted to the crystal channel directions in the substrate, the dopant ions predominately undergo large-angle scattering, which determines final mean penetration depth of the dopant ions. If the direction of the dopant ions is approximately parallel to a crystal channel direction, the dopant ions undergo mostly small-angle scattering as the dopant ions pass through the crystal lattice. The dopant ions remain in the same crystal channel ("channeling") and can penetrate deeper into the crystalline substrate than in case of large-angle scattering. Thus, ion beam implantation using the channeling effect has the potential to form doped regions with end-of-range peaks deeper below the main surface of a crystalline substrate than the end-of-range peaks of doped regions formed without channeling and by using the same acceleration energy for the dopant ions.

Figure 3:
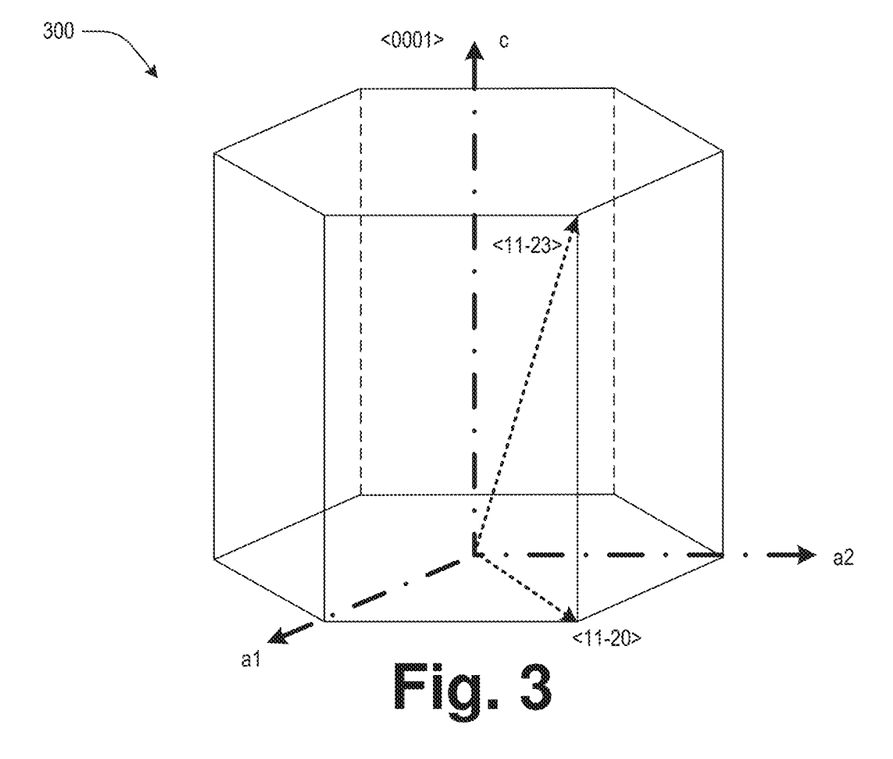
FIG. 3 is a diagram illustrating crystal directions for a crystal according to various examples.

A crystal direction, along which channeling effects outweigh the effect of large-angle scattering, may represent a crystal channel direction. Referring to FIG. 3, a diagram illustrating crystal directions for a hexagonal crystal 300 is provided, according to some embodiments. In some embodiments, crystal channel directions for the hexagonal crystal 300 include major crystal directions, such as the <0001> lattice direction or the <11-23> lattice direction.

The ion source 108A (FIG. 1) is oriented along a target axis 115A at a target angle, a, relative to a surface normal of the upper surface 200 of the drift layer 104, and the ion source 108B is oriented along a target axis 115B at a target angle, P, relative to the surface normal of the upper surface 200 of the drift layer 104. In some embodiments, the ion source 108A and the ion source 108B are the same ion source, albeit with different angle configurations. In some embodiments, the target angle is chosen such that the target axis 115A, 115B is parallel to a crystal channel direction or deviates from a crystal channel direction by at most ±1°. In some embodiments, the target axis 115A, 115B corresponds to an idle ion beam axis of the ion source 108A, 108B. The idle ion beam axis may be the default ion beam axis along which an ion beam propagates in an idle mode. In the idle mode, the ion source 108A, 108B uses a constant implant angle. In some embodiments, the target axis 115A, 115B is adjusted based on the cut angle, a, of the semiconductor body 102. For example, if the implantation process is intended to be performed along the <0001> direction, the target axis 115A is the same as the cut angle, a (see FIG. 2) or may deviate from the cut angle by at most ±1°. In another example, if the implantation process is intended to be performed along the <11-23> direction, which corresponds to a crystal channel angle of approximately 17° from the <0001> direction, the cut angle is subtracted from the crystal channel angle, so the target angle β is approximately 13° (±1°) for a cut angle, a, of 4° and respective rotational alignment In some embodiments, the semiconductor arrangement 100 is placed onto a substrate holder of an ion beam implantation apparatus including the ion source 108. The ion beam implantation apparatus is adapted for ion implantation at different implant angles, wherein the ion beam changes the implant angle in an implant angle plane that runs orthogonal to the upper surface 200. The ion beam has a default direction (idle ion beam axis). For ion beam implantation under changing implant angles, a deflection unit of the ion beam implantation apparatus deflects the ion beam with regard to the default orientation. The deflection is effective in an implant angle plane. In other words, for each implant angle, the ion beam axis and the target axis span the same plane. Prior to ion implantation, the semiconductor arrangement 100 may be aligned to the implant angle plane and to the idle ion beam axis. Alternatively and/or additionally, the semiconductor arrangement 100 may be aligned to the implant angle plane and to the idle ion beam axis during or after ion implantation. Alignment to the implant angle plane includes a rotational movement ("twist"). Alignment to the idle ion beam axis includes tilting the semiconductor arrangement 100. The beam-tilt alignment may precede or may follow the rotational alignment.

The rotational alignment brings the indicated major crystal plane in closer alignment with the implant angle plane. In other words, the rotational alignment brings a lateral major crystal direction in the pertinent major crystal plane in closer alignment with a lateral target direction in the implant angle plane.

In the ion beam implantation apparatus, the semiconductor arrangement 100 is oriented such that the preselected crystal channel direction of the semiconductor arrangement 100 is as best as possible aligned to the selected target axis 115A, 115B. The target axis 115A, 115B may be the default ion beam axis along which the dopant ions propagate in an idle mode providing ion implantation at a constant implant angle. The dopant ions are implanted by the ion source 108A, 108B after the rotational alignment and the beam-tilt alignment).

Due to technical imperfections related to the off-axis cut angle, a, and the alignment of the semiconductor arrangement 100, the target axis 115A, 115B may not be perfectly aligned to the crystal channel direction. In some embodiments, orienting the semiconductor arrangement 100 to a crystal channel direction defined by the target axis 115A, 115B relative to the ion source 108A, 108B includes orienting the semiconductor arrangement 100 to the crystal channel direction where the crystal channel direction is within an angle defined by the technical imperfections. In some embodiments, orienting the semiconductor arrangement 100 to a crystal channel direction defined by the target axis 115A, 115B relative to the ion source 108A, 108B includes orienting the semiconductor arrangement 100 to the crystal channel direction wherein a deviation angle from the crystal channel direction is less than 1° in the positive or negative direction.

Figure 4:
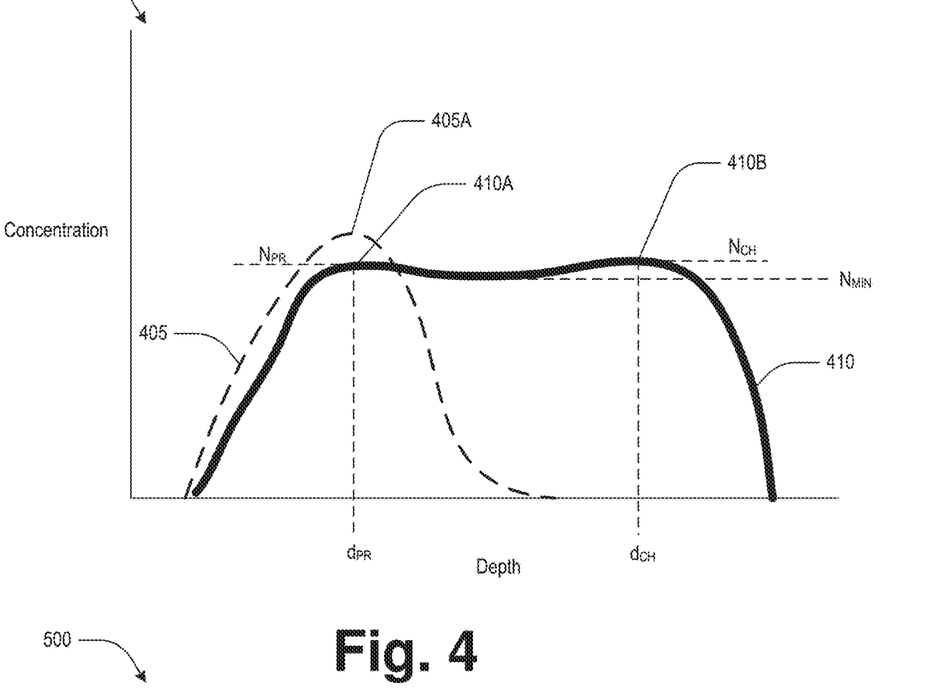
FIG. 4 is a diagram illustrating vertical distribution profiles for an implantation according to various examples.

Referring to FIG. 4, a diagram 400 illustrating vertical distribution profiles 405, 410 for a phosphorous implantation is provided, according to some embodiments. In some embodiments, the doped region 110 illustrated in FIG. 1 is formed using the implantation process corresponding to the vertical distribution profile 410.

The vertical distribution profile 405 represents a random implantation process performed at a reference angle of approximately 7° relative to the surface normal or 11° relative to the c-axis (<0001>). In the random implantation process, the dopant ions predominately undergo large-angle scattering, which determines a primary implantation peak 405A and the mean implantation depth of the dopant ions.

The vertical distribution profile 410 represents an implantation process performed using a <0001> target axis, where the dopant ions undergo both large-angle scattering to define a primary implantation peak 410A, and small-angle scattering as the dopant ions pass through channels in the crystal lattice resulting in a channeling implantation peak 410B. Primary and secondary (channeling) peaks are generally present for all channeling implants, albeit not always clearly distinguishable.

With respect to the vertical distribution profile 410, a distance between the channeling implantation peak 410B and the primary implantation peak 410A may depend on slight deviations between the crystal channel direction and the implant beam axis. Furthermore, the non-channeling dopant ions distribute in the drift layer 104 between the upper surface (zero depth) and the channeling implantation peak. In some embodiments, the distribution of the non-channeling dopant ions may be tuned by process parameters such as the implant angle range, the distribution of the implant angles within the implant angle range, implant energy, implant temperature, and/or implant dose.

At the channeling implantation peak 410B, the vertical distribution profile 410 has a first local dopant concentration maximum $N_{CH}$ at a first distance $d_{CH}$ to the upper surface 200. At the primary implantation peak 410A the vertical distribution profile 410 has a second local dopant concentration maximum $N_{PR}$ at a second distance $d_{PR}$. Between the first distance $d_{CH}$ and the second distance $d_{PR}$, the vertical distribution profiles have a local dopant concentration minimum $N_{MIN}$. The first distance $d_{CH}$ is greater than the second distance $d_{PR}$.

In some embodiments, a difference between the first distance $d_{CH}$ and the second distance $d_{PR}$ is in a range from 400 nm to 550 nm. In some embodiments, a ratio between the first local dopant concentration maximum $N_{CH}$ and the second local dopant concentration maximum $N_{PR}$ is in a range from 0.9 to 1.1. In some embodiments, a ratio between the sum of the first local dopant concentration maximum $N_{CH}$ and the second local dopant concentration maximum $N_{PR}$ and the local dopant concentration minimum $N_{MIN}$ is in a range from 5 to 7.

From the vertical distribution profiles 405, 410 it can be seen that the penetration depth is increased by up to a factor of about two for an implantation process performed along a channeling axis. In some embodiments, the penetration depth depends on parameters such as implantation energy, time, and dose. Varying these parameters varies the locations and magnitudes of the channeling implantation peaks 410B and the primary implantation peak 410A. For example, in some embodiments the magnitude of the channeling implantation peak 410B is greater than the magnitude of the primary implantation peak 410A.

In some embodiments, to achieve a vertical distribution for the dopants of the doped region 110 as homogeneous as possible, the implantation energy may be varied during implantation. For example, a first interval of the implantation is first performed with a first implantation energy and a second interval is performed with a second implantation energy less than the first implantation energy to avoid reducing the achievable maximum penetration depth significantly by the crystal damage generated during the first ion implantation. In some embodiments, at most two implantation energies are employed.

In embodiments, the doped region 110 is formed using the mask 106 to reduce the penetration depth of the dopants or to avoid the penetration of the dopants into the drift layer 104. In some embodiments, since the penetration depth of the channeling ions is relatively high and thus relatively low implantation energies are required for a given targeted penetration depth, a thickness of the mask 106 is reduced. In an embodiment where the doped region 110 comprises a current spread region for a device, penetration of the dopants can be avoided in the edge termination region of the devices using the mask 106 to maximize the blocking capability of this edge termination, with no adverse effects on the on resistance of power devices formed over the doped region 110.

In some embodiments, the doped region 110 is formed using multiple implantation intervals. In some embodiments, a first implantation interval is performed in the <0001> direction using the target axis 115A, and a second implantation interval is performed in the <11-23> direction using the target axis 115B. In some embodiments, the second interval is performed prior to the first interval. The combination of two implantation intervals using differing channeling angles generates a box-shaped vertical distribution profile with a wider width.

In some embodiments, the doped region 110 is formed using multiple implantation intervals with different dopants. In some embodiments, a first implantation interval is performed in the <0001> direction or the <11-23> direction using the target axis 115A or the target axis 115B and phosphorous as the dopant, and a second implantation interval is performed in the <11-23> direction using the target axis 115B and nitrogen as the dopant. In some embodiments, at most two implantation energies are employed for implanting phosphorous and/or at most two implantation energies are employed for implanting nitrogen. In some embodiments, the second interval is performed prior to the first interval. In some embodiments, the first interval implantation is performed using phosphorous and an implant energy of about 800-1200 keV and a dose of about $10^{13}/cm^2$. In some embodiments, a dose of $10^{13}/cm^2$ yields a box-like vertical distribution profile, where the concentration at the channeling implantation peak is about the same as the concentration at the primary implantation peak. Higher dose values may result in an increase of the primary implantation peak relative to the channeling implantation peak. In some embodiments, the dose is between about $10^{13}/cm^2$ and $5 \times 10^{13}/cm^2$. In some embodiments, the second interval implantation is performed using nitrogen and an implant energy of greater than 300 keV. In some embodiments, the second interval implantation is performed using nitrogen and an implant energy of about 1500 keV. In some embodiments, a dose of the nitrogen is about $10^{13}/cm^2$. In some embodiments, the second interval is performed prior to the first interval.

Figure 5:
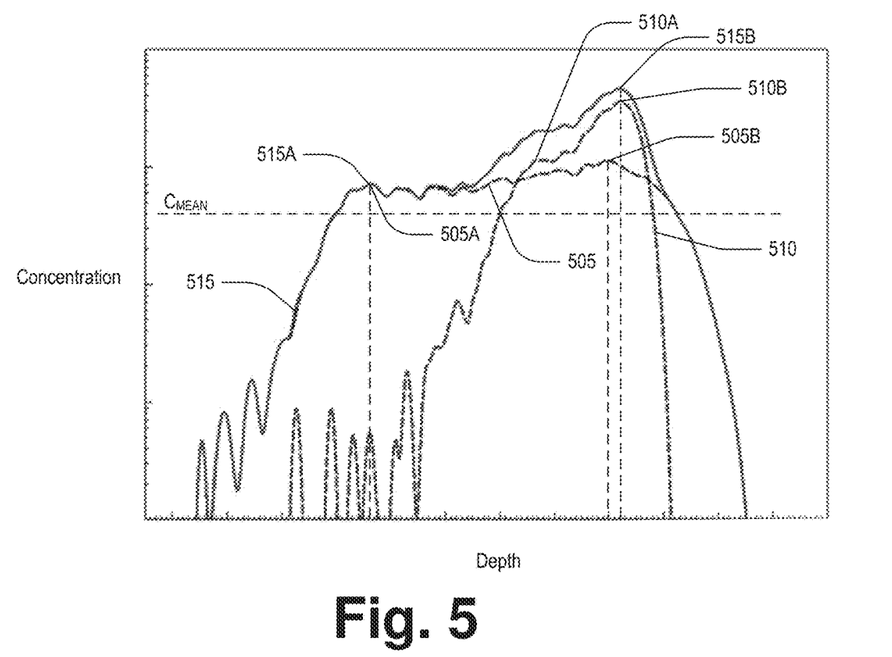
FIG. 5 is a diagram illustrating vertical distribution profiles for a multiple stage implantation according to various examples.

Referring to FIG. 5, a diagram 500 illustrating vertical distribution profiles 505, 510, 515 for a phosphorous and nitrogen multiple interval implantation is provided, according to some embodiments. The vertical distribution profile 405 in FIG. 4 illustrates a profile without variation and/or noise arising from simulation and/or secondary ion mass spectrometry (SIMS) analysis, while the vertical distribution profiles 505, 510, 515 in FIG. 5 includes variation and/or noise arising from simulation and/or SIMS analysis, for example.

The vertical distribution profile 505 represents a first interval phosphorous implantation process. In some embodiments, the first interval phosphorous implantation process is performed using a <11-23> crystal channel direction or a <0001> crystal channel direction. The vertical distribution profile 505 comprises a primary implantation peak 505A and a channeling implantation peak 505B. The vertical distribution profile 510 represents a second interval nitrogen implantation process. In some embodiments, the second interval nitrogen implantation process is performed using a <0001> crystal channel direction. The vertical distribution profile 510 comprises a primary implantation peak 510A and a channeling implantation peak 510B. The vertical distribution profile 515 represents the combined phosphorous and nitrogen vertical distribution. The vertical distribution profile 515 comprises a primary implantation peak 515A and a channeling implantation peak 515B. In some embodiments a depth of the channeling implantation peak 510B is greater than a depth of the channeling implantation peak 505B.

In some embodiments, the local maximum concentration at the channeling implantation peak 505B, is greater than the local maximum concentration at the primary implantation peak 505A. The implantation parameters, such as energy and dose, impact the relative magnitudes of the local maximum concentrations at the implantation peaks 410A, 410B, 505A, 505B, 510A, 510B.

Forming the doped region 110 in the drift layer 104 using one or more channeled implantation processes provides a vertical distribution profile with reduced ripple compared to implantation processes using multiple interval non-channeled implantations comprising different energies. In some embodiments, a vertical extension region is defined as a region of the vertical distribution profile 410, 505. A vertical extension region is defined as a region vertically delimited by the primary implantation peak 410A, 505A and the channeling implantation peak 410B, 505B, where a profile of the dopant concentration between the primary implantation peak 410A, 505A and the channeling implantation peak 410B, 505B has at most one turning-point (e.g., local minimum). In some embodiments, a ratio between the maximum doping dosage of either the primary implantation peak 410A, 505A or the channeling implantation peak 410B, 505BA and the minimum concentration within the vertical extension region is less than about 2.0. In some embodiments, the maximum to minimum doping ratio is less than about 1.8 or less than about 1.5. Channeled implants result in reduced damage to the drift layer 104, allowing activation annealing to be performed at a lower temperature-time product. In some embodiments, the vertical extension region can have a full width at half maximum (FWHM) range where the concentrations at the boundaries of the vertical extension region are about half the maximum concentrations, such as at the maximum concentrations at one of the implantation peaks 410A, 410B, 505A, 510B.

In the vertical extension region, the dopant concentrations between the primary implantation peak 410A, 505A and the channeling implantation peak 410B, 505B are less than the dopant concentrations of the channeling implantation peak 410B, 505B. In some embodiments, the dopant concentrations between the primary implantation peak 410A, 505A and the channeling implantation peak 410B, 505B are greater than the dopant concentrations at the FWHM. In some embodiments, the vertical extension region has an average dopant concentration greater than a mean dopant concentration of the doped region 110.

In some embodiments, for a nitrogen implantation, the doped region 110 has a vertical extension from about 0.2 to 0.8 um, resulting in a depth range of at least about 600 nm. In some embodiments, for a phosphorous and nitrogen implantation, the doped region 110 has a vertical extension from about 0.2 to 2.1 um. In some embodiment, the doped region 110 comprises a first portion comprising phosphorous and a second portion comprising nitrogen, and the second portion has a minimum depth greater than a minimum depth of the first portion and a maximum depth greater than a maximum depth of the first portion. In some embodiments, a ratio of dopant maximum concentration to minimum concentration in the vertical extension region is less than 2.0. In some embodiments, a ratio of dopant maximum concentration to minimum concentration in the vertical extension region is less than 1.2.

Figure 6:
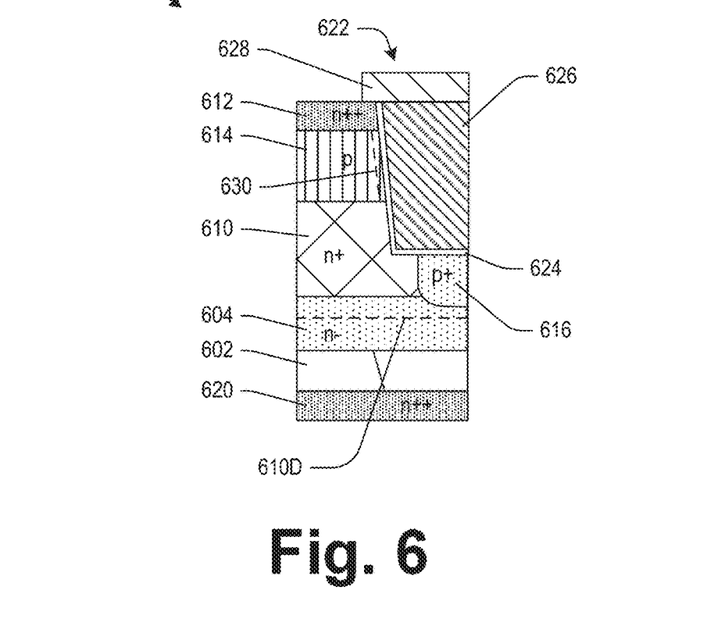
FIG. 6 is a cross-section view of a semiconductor device according to various examples.

Referring to FIG. 6, a cross-section view of a semiconductor device 600 is provided, according to some embodiments. In some embodiments, the semiconductor device 600 is an insulated gate bipolar transistor (IGBT), a metal oxide semiconductor controlled diode (MCD), or an insulated gate field effect transistor (IGFET), such as a metal oxide semiconductor field effect transistor (MOSFET).

The semiconductor device 600 comprises a semiconductor body 602, a drift layer 604, a current spread region 610, a source region 612, a body region 614, a diode region 616, a drain region 620, a gate structure 622 including a gate dielectric layer 624 and a gate electrode 626, and a gate cap 628 over the gate structure 622. In some embodiments, the drift layer 604 is lightly doped (n−), the current spread region 610 has a medium dopant concentration (n+) and the source region 612 and the drain region 620 are highly doped (n++). The body region 614 has a medium dopant concertation (p) and the diode region 616 is highly doped (p+). In some embodiments, the current spread region 610 has a depth 610D greater than the depth of the diode region 616. In some embodiments, the current spread region 610 is formed using one or more of the channeling techniques described in reference to FIGS. 1-5.

In some embodiments, the body region 614 is between the source region 612 and the current spread region 610. The diode region 616 forms a pn junction with the drift layer 604 and the current spread region 610. In some embodiments, a drain contact for the semiconductor device 600 contacts the drain region 620.

In some embodiments, the semiconductor device 600 is a MOS transistor device with an integrated diode. The conductivity types illustrated in the semiconductor device 600 are for an n-type device. In some embodiments, a p-type device is realized by reversing the conductivity types. The semiconductor device 600 can be implemented as an enhancement (normally-off) device or as a depletion (normally-on) device. In an enhancement device, the body region 614 are adjacent the gate dielectric layer 624. In a depletion device a channel region 630 (illustrated in dashed lines in FIG. 6) of the same doping type as the source region 612 and the drift layer 604 is formed along the gate dielectric layer 624. In some embodiments, the channel region 630 extends from the body region 614 to the current spread region 610 along the gate dielectric layer 624 and is depleted of charge carriers when the transistor device is switched off. Alternatively, the gate dielectric layer 624 comprises fixed charges that cause the formation of a conducting channel in the body region 614 along the gate dielectric layer 624 when the gate drive voltage (gate-source voltage) is zero.

In some embodiments, the semiconductor device 600 is implemented as a MOSFET or as an IGBT. In a MOSFET, the drain region 620 has the same conductivity type as the source region 612 and the drift layer 604, while in an IGBT the drain region 620 has a conductivity type complementary to the conductivity type of the source region 612 and the drift layer 604. In an IGBT, the drain region 620 is referred to as a collector region.

The diode region 616 has the same conductivity type as the body region 614, which is complementary to the conductivity type of the drift layer 604. In some embodiments, the diode region 616 of the semiconductor device 600 adjoin the body region 614 of a neighboring device, thus the body region 614 of each device cell is electrically connected to the source electrode through the diode region of a neighboring device cell.

The diode region 616 forms a bipolar diode with the drift layer 604 and the current spread region 610. The drain-source path of the semiconductor device 600 extends from the source region 612 to the drain region 620 through the body region 614, the current spread region 610, the drift layer 604, and the semiconductor body 102. The diode region 616 is reverse biased when a voltage with a first polarity is applied between the drain and source terminals, and the diode region 616 is forward biased (conduct) when a voltage with a second polarity is applied between the drain and source terminals. In an n-type semiconductor device, the diode region 616 is reverse biased when a positive voltage is applied between the drain and source terminals D, S, and the diode region 616 is forward biased when a negative voltage is applied between the drain and source terminals. The diode region 616 is parallel to body diodes of the semiconductor device 600 formed by the body region 614, the current spread region 610, and the drift layer. However, unlike the body diodes, the properties of the diode region 616 can be adjusted widely independent of the properties of the MOS transistor.

Figure 7:
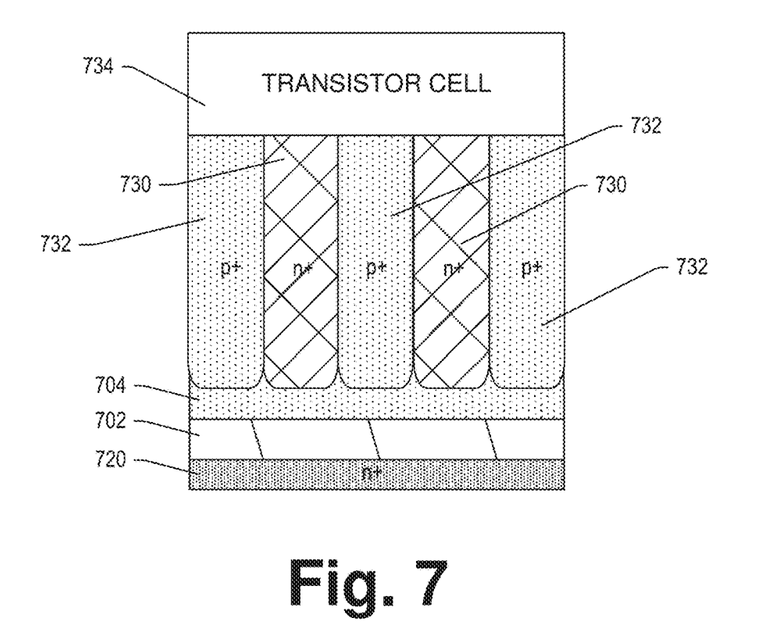
FIG. 7 is a cross-section view of a semiconductor device according to various examples.

Referring to FIG. 7, a cross-section view of a semiconductor device 700 is provided, according to some embodiments. In some embodiments, the semiconductor device 700 is a super-junction device. The semiconductor device 700 comprises a semiconductor body 702, a drift layer 704, and pillars 730, 732. In some embodiments, the number of pillars 730, 732 varies. In some embodiments, the drift layer 704 is lightly doped (n−), the body region 714 has a medium concentration (p), the pillars 732 are highly doped (p+), and the pillars 730 are highly doped (n+). In some embodiments, the total dopant count in the n-type pillars 730 is substantially equal to the total dopant count in the p-type pillar 732 (or pillars) such that during operation the charge is balanced and the pillars are completely depleted before breakdown. In some embodiments, a transistor cell 734 is formed over the pillars 730, 732. In some embodiments, the transistor cell includes the source and drain regions of the semiconductor device 700. In some embodiments, the pillars 730 are formed using one or more of the channeling techniques described in reference to FIGS. 1-5.

According to some embodiments, a method includes orienting a silicon carbide layer to a first crystal channel direction relative to a first ion beam and implanting phosphorous into the silicon carbide layer using the first ion beam to define a first doped region in the silicon carbide layer. A deviation angle between the first crystal channel direction and the first ion beam is less than ±1° and the first crystal channel direction comprises a <0001> direction or a <11-23> direction.

According to some embodiments, an apparatus includes means for orienting a silicon carbide layer to a first crystal channel direction relative to a first ion beam and means for implanting phosphorous into the silicon carbide layer using the first ion beam to define a first doped region in the silicon carbide layer. A deviation angle between the first crystal channel direction and the first ion beam is less than ±1° and the first crystal channel direction comprises a <0001> direction or a <11-23> direction.

According to some embodiments, implanting phosphorous includes implanting the phosphorous at an implantation energy greater than 500 keV.

According to some embodiments, implanting phosphorous includes implanting the phosphorous at a dose less than $5 \times 1013/cm^2$.

According to some embodiments, the first doped region has a vertical extension region having a dopant concentration greater than a mean dopant concentration of the first doped region, and a ratio between a maximum dopant concentration in the vertical extension region and a minimum dopant concentration in the vertical extension region is less than about 2.0.

According to some embodiments, the vertical extension region has a depth range of at least 600 nm.

According to some embodiments, a first portion of the doped region includes phosphorous, and the method includes orienting the silicon carbide layer to a second crystal channel direction relative to a second ion beam and implanting nitrogen into the silicon carbide layer using the second ion beam to define a second portion of the first doped region in the silicon carbide layer overlapping the first portion of the first doped region. A deviation angle between the second crystal channel direction and the second ion beam is less than ±1°.

According to some embodiments, the first portion comprises a primary implantation peak and a channeling implantation peak, the second portion comprises a primary implantation peak and a channeling implantation peak, and the channeling implantation peak of the second portion has a depth greater than a depth of the channeling implantation peak of the first portion.

According to some embodiments, the first portion comprises a primary implantation peak and a channeling implantation peak, the second portion comprises a primary implantation peak and a channeling implantation peak, and the primary implantation peak of the second portion has a depth less than a depth of the primary implantation peak of the first portion.

According to some embodiments, the second crystal channel direction comprises a <11-23> direction or a <0001> direction.

According to some embodiments, implanting phosphorous comprises implanting the phosphorous using at most two implantation energies.

According to some embodiments, a method includes orienting a silicon carbide layer to a first crystal channel direction relative to a first ion beam and implanting nitrogen into the silicon carbide layer using the first ion beam to define a first doped region in the silicon carbide layer. The first crystal channel direction comprises a <0001> direction and a deviation angle between the first crystal channel direction and the first ion beam is less than ±1°.

According to some embodiments, an apparatus includes means for orienting a silicon carbide layer to a first crystal channel direction relative to a first ion beam and means for implanting nitrogen into the silicon carbide layer using the first ion beam to define a first doped region in the silicon carbide layer. The first crystal channel direction comprises a <0001> direction and a deviation angle between the first crystal channel direction and the first ion beam is less than ±1°.

According to some embodiments, implanting nitrogen includes implanting the nitrogen at an implantation energy greater than 300 keV.

According to some embodiments, implanting nitrogen includes implanting the nitrogen at a dose less than $5 \times 10^{13}/\text{cm}^2$.

According to some embodiments, a semiconductor device includes a semiconductor body comprising a first doped region and a first surface. The semiconductor body comprises silicon carbide, the first doped region comprises a primary implantation peak having a first dopant concentration at a first depth from the first surface and a channeling implantation peak having a second dopant concentration at a second depth from the first surface. A vertical extension region is defined between the first depth and the second depth. A ratio between a maximum dopant concentration in the vertical extension region and a minimum dopant concentration in the vertical extension region is less than about 2.0.

According to some embodiments, the vertical extension region has an average dopant concentration greater than a mean dopant concentration of the first doped region.

According to some embodiments, the first doped region includes phosphorous.

According to some embodiments, the first doped region includes phosphorous and nitrogen.

According to some embodiments, a maximum depth from the first surface of a first portion of the first doped region including nitrogen is greater than a maximum depth from the first surface of a second portion of the first doped region including phosphorous.

According to some embodiments, the resulting implanted dopant profile consists of exactly two local maxima and a drop of dopant concentration between these two local maxima of less than 50% or less than 20% or less than 10%.

According to some embodiments, a gate structure extends from the first surface into the semiconductor body, a body region is in the semiconductor body and contacting the gate structure, and a source region is in the semiconductor body and contacting the body region and the gate structure.

The first doped region is under the source region.

According to some embodiments, a diode region is in the semiconductor body under the source region. The first doped region comprises a current spread region under and contacting the diode region.

According to some embodiments, a first pillar in the semiconductor body comprises the first doped region and a second pillar in the semiconductor body is adjacent the first pillar. The first doped region comprises an n-type impurity and the second pillar comprises a p-type impurity.

According to some embodiments, the first doped region comprises nitrogen and phosphorous.

It may be appreciated that combinations of one or more embodiments described herein, including combinations of embodiments described with respect to different figures, are contemplated herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

What is claimed is:

1. A method comprising:
   orienting a silicon carbide layer having a first surface to a first crystal channel direction relative to a first ion beam, wherein a deviation angle between the first crystal channel direction and the first ion beam is less than ±1°;
   implanting phosphorous into the silicon carbide layer using the first ion beam to define a first portion of a first doped region in the silicon carbide layer, wherein the first crystal channel direction comprises a <0001> direction or a <11-23> direction;

orienting the silicon carbide layer to a second crystal channel direction relative to a second ion beam, wherein a deviation angle between the second crystal channel direction and the second ion beam is less than ±1°; and implanting nitrogen into the silicon carbide layer using the second ion beam to define a second portion of the first doped region in the silicon carbide layer overlapping the first portion of the first doped region, wherein:

the first portion of the first doped region comprises a primary implantation peak having a first dopant concentration at a first depth from the first surface and a channeling implantation peak having a second dopant concentration at a second depth from the first surface;

a vertical extension region is defined between the first depth and the second depth;

a ratio between a maximum dopant concentration in the vertical extension region and a minimum dopant concentration in the vertical extension region is less than about 2.0;

the second portion of the first doped region comprises a primary implantation peak and a channeling implantation peak; and the channeling implantation peak of the second portion of the first doped region has a depth from the first surface greater than the second depth of the channeling implantation peak of the first portion of the first doped region.

2. The method of claim 1, wherein implanting phosphorous comprises:
implanting the phosphorous at an implantation energy greater than 500 keV.

3. The method of claim 1, wherein implanting phosphorous comprises:
implanting the phosphorous at a dose less than $5 \times 10^{13}/cm^2$.

4. The method of claim 1, wherein:
the vertical extension region has a dopant concentration greater than a mean dopant concentration of the first portion of the first doped region.

5. The method of claim 1 where the vertical extension region has a depth range of at least 600 nm.

6. The method of claim 1, wherein:
the primary implantation peak of the second portion of the first doped region has a depth from the first surface greater than the first depth of the primary implantation peak of the first portion of the first doped region.

7. The method of claim 1, wherein the second crystal channel direction comprises a <11-23> direction or a <0001> direction.

8. The method of claim 1, wherein implanting phosphorous comprises:
implanting the phosphorous using at most two implantation energies.

9. The method of claim 1, wherein:
a minimum depth from the first surface of the first portion of the first doped region is less than a minimum depth from the first surface of the second portion of the first doped region; and a maximum depth from the first surface of the first portion of the first doped region is greater than a maximum depth from the first surface of the second portion of the first doped region.

10. A method comprising:
orienting a silicon carbide layer having a first surface to a first crystal channel direction relative to a first ion beam;

implanting phosphorous into the silicon carbide layer using the first ion beam to define a first doped region in the silicon carbide layer, wherein the first crystal channel direction comprises a <0001> direction and a deviation angle between the first crystal channel direction and the first ion beam is less than ±1°; and implanting nitrogen into the silicon carbide layer using the first ion beam to define a second doped region in the silicon carbide layer, wherein:

the first doped region comprises a primary implantation peak having a first dopant concentration at a first depth from the first surface and a channeling implantation peak having a second dopant concentration at a second depth from the first surface;

a vertical extension region is defined between the first depth and the second depth;

a ratio between a maximum dopant concentration in the vertical extension region and a minimum dopant concentration in the vertical extension region is less than about 2.0;

a minimum depth of the first doped region from the first surface is less than a minimum depth from the first surface of the second doped region;

a maximum depth of the first doped region from the first surface is greater than a maximum depth from the first surface of the second doped region; and a maximum depth from the first surface of the second doped region comprising a local maximum concentration of nitrogen is greater than a maximum depth from the first surface of the first doped region comprising a local maximum concentration of phosphorous.

11. The method of claim 10, wherein implanting nitrogen comprises:
implanting the nitrogen at an implantation energy greater than 300 keV.

12. The method of claim 10, wherein implanting nitrogen comprises:
implanting the nitrogen at a dose less than $5 \times 10^{13}/cm^2$.

13. The method of claim 10, wherein:
the local maximum concentration of phosphorous comprises a channeling implantation peak of the first doped region; and the local maximum concentration of nitrogen comprises a channeling implantation peak of the second doped region.

14. The method of claim 10, wherein:
the local maximum concentration of phosphorous comprises a primary implantation peak of the first doped region; and the local maximum concentration of nitrogen comprises a primary implantation peak of the second doped region.

15. A semiconductor device, comprising:
a semiconductor body comprising a first doped region and a first surface, wherein:

the semiconductor body comprises silicon carbide;

the first doped region comprises a primary implantation peak having a first dopant concentration at a first depth from the first surface and a channeling implantation peak having a second dopant concentration at a second depth from the first surface;

a vertical extension region is defined between the first depth and the second depth;

a ratio between a maximum dopant concentration in the vertical extension region and a minimum dopant concentration in the vertical extension region is less than about 2.0;
the first doped region comprises phosphorous and nitrogen; and
a maximum depth from the first surface of a first portion of the first doped region comprising a local maximum concentration of nitrogen is greater than a maximum depth from the first surface of a second portion of the first doped region comprising a local maximum concentration of phosphorous.

16. The semiconductor device of claim 15, wherein:
the vertical extension region has an average dopant concentration greater than a mean dopant concentration of the first doped region.

17. The semiconductor device of claim 15, wherein:
an implanted dopant profile of the first doped region consists of exactly two local maxima and a drop of dopant concentration between these two local maxima of less than 50% or less than 20% or less than 10%.

18. The semiconductor device of claim 15, comprising:
a gate structure extending from the first surface into the semiconductor body;
a body region in the semiconductor body and contacting the gate structure; and
a source region in the semiconductor body and contacting the body region and the gate structure, wherein:
the first doped region is under the source region.

19. The semiconductor device of claim 18, comprising:
a diode region in the semiconductor body under the source region, wherein:
the first doped region comprises a current spread region under and contacting the diode region.

20. The semiconductor device of claim 15, comprising:
a first pillar in the semiconductor body and comprising the first doped region; and
a second pillar in the semiconductor body adjacent the first pillar, wherein
the first doped region comprises an n-type impurity; and
the second pillar comprises a p-type impurity.

21. The semiconductor device of claim 15, wherein:
the local maximum concentration of phosphorous comprises a channeling implantation peak of the first portion of the first doped region; and
the local maximum concentration of nitrogen comprises a channeling implantation peak of the second first portion of the first doped region.

22. The semiconductor device of claim 15, wherein:
the local maximum concentration of phosphorous comprises a primary implantation peak of the first portion of the first doped region; and
the local maximum concentration of nitrogen comprises a primary implantation peak of the second first portion of the first doped region.

23. The semiconductor device of claim 15, wherein:
a minimum depth from the first surface of the first portion of the first doped region is less than a minimum depth from the first surface of the second portion of the first doped region; and
a maximum depth from the first surface of the first portion of the first doped region is greater than a maximum depth from the first surface of the second portion of the first doped region.

* * * * *